United States Patent [19]
Uchida

[11] Patent Number: 5,061,980
[45] Date of Patent: Oct. 29, 1991

[54] SEMICONDUCTOR INTEGRATED CIRCUIT DEVICE

[75] Inventor: Makio Uchida, Fuchu, Japan

[73] Assignee: Hitachi, Ltd., Tokyo, Japan

[21] Appl. No.: 564,594

[22] Filed: Aug. 9, 1990

Related U.S. Application Data

[60] Continuation of Ser. No. 253,673, Oct. 5, 1988, Pat. No. 4,990,992, which is a division of Ser. No. 41,759, Apr. 21, 1987, Pat. No. 4,782,465, which is a continuation of Ser. No. 635,210, Jul. 27, 1984, abandoned.

[30] Foreign Application Priority Data

Jul. 27, 1983 [JP] Japan ................................ 58-135815

[51] Int. Cl.$^5$ ........................ H01L 27/02; H01L 27/10
[52] U.S. Cl. .................................. 357/41; 357/23.14; 357/45
[58] Field of Search .................. 357/23.14, 42, 45, 40, 357/41; 365/230.03

[56] References Cited

U.S. PATENT DOCUMENTS

Re. 32,993 1/1989 Anami et al. ................... 365/230.03
4,208,727 12/1980 Rediome et al. ..................... 357/45

Primary Examiner—J. Carroll
Attorney, Agent, or Firm—Antonelli, Terry, Stout & Kraus

[57] ABSTRACT

A memory array is divided into a plurality of circuit blocks which each include wirings composed of electrically conductive polycrystalline silicon layers and circuit elements that will be operated by signals supplied via the wirings. Each circuit block is served with a signal via an aluminum layer. The signal supplied to the circuit block is transmitted to the circuit elements via an internal wiring. If the aluminum layer is broken, the circuit blocks formed on the remote side beyond the broken portion fail to work properly. Therefore, breakage of the aluminum layer can be easily detected. Further, since signals are supplied to the circuit blocks via an aluminum layer, the memory array operates at increased speeds.

21 Claims, 8 Drawing Sheets

SEMICONDUCTOR INTEGRATED CIRCUIT DEVICE

This is a continuation application of U.S. Ser. No. 07/253,673, filed Oct. 5, 1988, U.S. Pat. No. 4,990,992 which is a Divisional application of U.S. Ser. No. 041,759, filed Apr. 21, 1987, U.S. Pat. No. 4,782,465 which is a continuation application of U.S. Ser. No. 06/635,210, filed July 27, 1984 abandoned.

BACKGROUND OF THE INVENTION

The present invention relates to a semiconductor integrated circuit device, and particularly to an art which can be effectively adapted to semiconductor integrated circuit devices that include semiconductor memory devices such as random access memory (hereinafter referred to as RAM), read-only memory (hereinafter referred to as ROM), and the like.

A semiconductor memory device such as a RAM or a ROM is typically constituted by an electrically conductive polycrystalline silicon layer in which word lines are formed together with gate electrodes of elements that form memory cells, in order to increase the degree of integration. The electrically conductive polycrystalline silicon layer has a sheet resistivity of as relatively high as 30 to 40 ohms/□ and causes the propagation of signals to be delayed.

In order to reduce the delay of signal propagation, it has been proposed to form a metal wiring layer of a small resistivity (e.g., several milliohms/□) in parallel with the wiring means, and connect them together at predetermined distance intervals.

However, the inventors of the present invention have found that the above construction gives rise to the occurrence of a problem as described below. Namely, in case the metal wiring layer is broken due to defects during the manufacturing process, resistance of the wiring layer formed on the side remote from the broken portion becomes considerably greater than that of the circuit which supplies signals to the word lines. Electrically, however, the above-mentioned circuit and a memory cell are coupled together via the electrically conductive polycrystalline silicon layer having relatively large resistivity. In other words, the memory cell is selected even when the metal wiring layer has been broken.

Therefore, breakage in the metal wiring layer in the semiconductor memory device cannot be detected by the d-c operation test according to which output signals are simply checked by supplying address signals to the semiconductor memory device.

In case the metal wiring layer has been broken, memory cells formed on the side remote from the broken portion are served with select signals via the electrically conductive polycrystalline silicon layer having relatively large resistivity. Therefore, the time for selecting such memory cells becomes longer than the time for selecting other memory cells. The above-mentioned d-c operation test is not capable of detecting a semiconductor memory device (hereinafter referred to as memory) which contains memory cells that require different times for the selection operation. Consequently, memories having low reliability are often shipped.

To sort out memories that are regarded as defective, it is necessary to perform an a-c operation test according to which output signals are examined after a predetermined period of time has passed from the supply of address signals. This results in a very cumbersome sorting operation. In other words, attention must be given sufficiently to timings for supplying signals to the memory that is to be tested and to timings for examining the signals produced by the memory. Thus, the testing procedure becomes quite cumbersome.

In particular, in the case of a memory contained in a large-scale integrated circuit device such as one-chip microcomputer, in general, it is not allowed to directly supply address signals from the external unit and to directly take out the output signals to the external unit. Accordingly, the a-c operation test must be conducted by giving attention to the delay time of a logic circuit interposed between a terminal of such a one-chip microcomputer and an address input terminal of a memory contained therein, as well as to the delay time of a logic circuit interposed between a data input/output terminal of the memory contained therein and a terminal of the one-chip microcomputer. That is, by taking at least the above-mentioned two delay times into consideration, the time is found at which output signals of the memory will be produced from the microcomputer after address signals have been input to the microcomputer. The operation test is carried out by supplying address signals to the microcomputer, and examining output signals of the microcomputer after the above-found time has passed. As described above, it is necessary to find the above-mentioned time beforehand, making the operation test even more difficult. Moreover, correct results of the test are generally not expected.

SUMMARY OF THE INVENTION

The object of the present invention is to provide a semiconductor integrated circuit device which can be easily evaluated through a simple test.

Another object of the present invention is to provide a semiconductor integrated circuit device which enables a propagation delay time in a signal line to be shortened, and which can be evaluated through a simple operation test.

Further objects of the present invention will become obvious from the description of the specification and the accompanying drawings.

DESCRIPTION OF THE PREFERRED EMBODIMENTS

Figure 1:
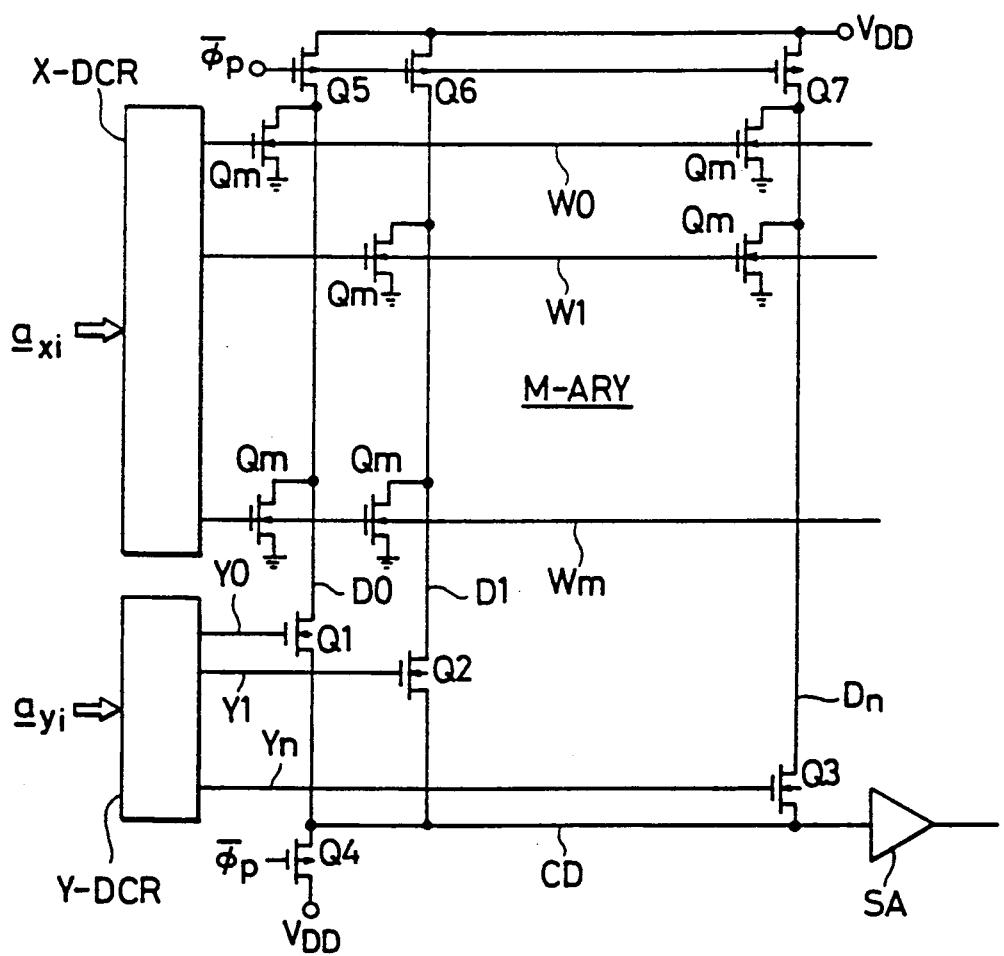
FIG. 1 is a circuit diagram of a ROM according to an embodiment of the present invention.

FIG. 1 is a circuit diagram of a lateral ROM according to an embodiment of the present invention. Though there is no particular limitation, the circuit elements are formed on a semiconductor substrate such as single crystalline silicon by the conventional technique for producing CMOS (complementary MOS) integrated circuits.

An address decoder X-DCR receives a plurality of first complementary address signals $a_{xi}$ consisting of a plurality of internal address signals and a plurality of internal address signals having substantially inverted phase relative thereto, forms a select signal, and sends the select signal to a word line W that is selected by the complementary address signals out of a plurality of word lines formed in a memory array M-ARY. An address decoder Y-DCR receives a plurality of second complementary address signals $a_{yi}$, forms a select signal, and sends the select signal to a column switching circuit such that a data line D is selected by the complementary address signals out of a plurality of data lines formed in the memory array M-ARY.

The memory array M-ARY consists of a plurality of word lines W0 to Wm, a plurality of data lines D0 to Dn, insulated gate field effect transistors (hereinafter referred to as MOSFET's) for storing data that are selectively provided according to stored data at intersecting points of these word lines and data lines, and column switching MOSFET's Q1 to Q3 that are provided between the data lines D0 to Dn and a common data line CD. Here, to simplify the drawing, FIG. 1 representatively shows word lines W0, W1, Wm and data lines D0, D1, Dn among a plurality of word lines and data lines. Further, FIG. 1 shows only those memory MOSFET's of which the threshold voltage is turned on at the select level of the word lines, but does not show those memory MOSFET's which are turned off, or of which the gates or drains have not been connected. In the memory array M-ARY, gates of the memory MOSFET's Qm arranged on the same column are connected to the word lines W0 to Wm that are corresponding thereto, respectively. Drains of the memory MOSFET's Qm arranged on the same row are connected t the data lines D0 to Dn that are corresponding thereto, respectively. Though there is no particular limitation, the memory MOSFET's Qm and the column switching MOSFET's Q1 to Q3 consist of n-channel MOSFET's that are formed in the same well region.

The common data line CD is connected to the input terminal of a sense amplifier SA which amplifies the data of memory MOSFET's (memory cells) transmitted to the common data line CD. Depending upon the data of the memory cells, therefore, the sense amplifier SA produces a read signal of the high level or the low level In this embodiment, though there is no particular limitation, precharging MOSFET's Q5 to Q7 are provided for the data lines D0 to Dn in addition to a precharging MOSFET Q4 that is provided for the common data line CD, in order to increase the speed of the reading operation. Though there is no particular limitation, these precharging MOSFET's Q4 to Q7 consist of p-channel enhancement MOSFET's. A precharge signal $\overline{\phi p}$ is commonly applied to the gates of these precharging MOSFET's. The precharge signal $\overline{\phi p}$ is produced by a timing signal generator (not diagramed) that is formed on the same semiconductor substrate as that of the lateral ROM.

Figure 2:
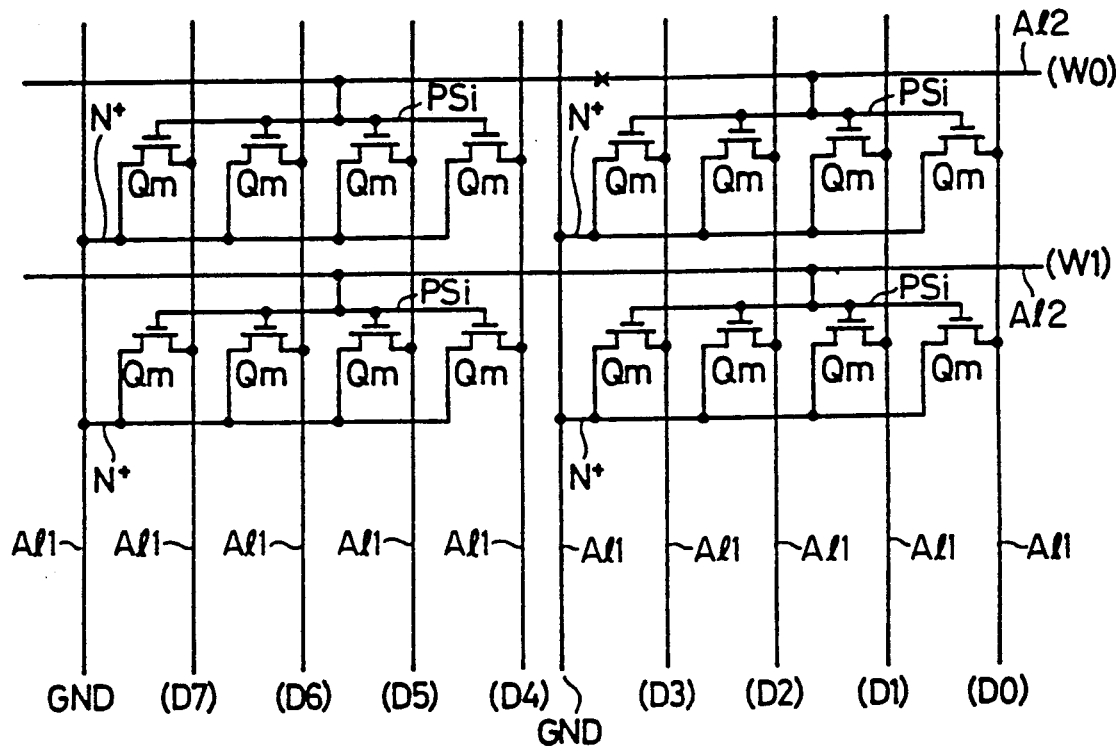
FIG. 2 is a circuit diagram which illustrates the layout of ROM.

FIG. 2 is a circuit diagram which concretely illustrates the memory array M-ARY according to the embodiment. Namely, in this embodiment, the memory array M-ARY is constructed as described below in order to shorten the propagation delay time in the word lines and in the ground lines of the circuit. Further, by virtue of this arrangement, line breakage can be easily detected.

That is, as represented by word lines W0, W1 in FIG. 2, gates of four memory MOSFET's Qm (though the number needs not be limited to four) arranged on the same row are commonly connected together by an electrically conductive polycrystalline silicon layer PSi that is formed together with the gate electrodes as a unitary structure. This PSi layer may be referred to as a "divided sub-word line". Further, although there is no particular limitation, a second aluminum layer Al2 is formed on the semiconductor substrate via an insulation layer for each row, and is arranged substantially in parallel with the electrically conductive polycrystalline silicon layer PSi. The electrically conductive polycrystalline silicon layer PSi and the second aluminum layer Al2 are connected to each other at one place (i.e. at one point).

Source electrodes of the four memory MOSFET's Qm are formed by a common diffusion layer N+ and are commonly connected together. The common diffusion layer is connected, through one place (i.e. one point), to a ground line GND of the circuit which consists of a first aluminum layer that is formed on the semiconductor substrate via an insulation layer and that runs in the same direction as the data line D, or in other words, which consists of a first aluminum layer Al1 formed substantially in parallel with the data line D.

Moreover, though there is no particular limitation, the individual drain regions of memory MOSFET's Qm arranged on the same column are connected to data lines D0 to D7 which consist of first aluminum layers Al1 formed on the semiconductor substrate via an insulation layer.

The electrically conductive polycrystalline silicon layer PSi is formed on the semiconductor substrate via an insulation film. Further, an insulation film is formed between the electrically conductive polycrystalline silicon layer PSi and the first aluminum layer Al1, between the first aluminum layer Al1 and the second aluminum layer Al2, and between the electrically conductive polycrystalline silicon layer PSi and the second aluminum layer Al2. Therefore, when different wiring layers are to be coupled together, such as in the case of coupling the second aluminum layer Al2 and the electrically conductive polycrystalline silicon layer PSi, a hole for contact is formed in an insulation film that is formed between these wirings, and these wiring are coupled together via the hole. As described above, when different wiring layers are to be coupled together through one place (such as in the case of coupling the polycrystalline silicon layer PSi and the second aluminum layer Al2, and in the case of coupling a semiconductor region formed in the semiconductor substrate and the first aluminum layer Al1), a hole for contact is formed in the insulation film interposed therebetween, and the wirings are coupled together via the contact hole.

The circuit of this embodiment operates as described below.

The precharge signal $\phi p$ assumes the low level prior to reading the data stored in the memory cells. Therefore, the precharging MOSFET's Q4 to Q7 are rendered conductive, and the common data line CD and the individual data lines D0 to Dn are precharged to the level of powersource voltage $V_{DD}$. Then, the precharge signal $\overline{\phi p}$ assumes the high level to render the precharging MOSFET's Q4 to Q7 nonconductive, whereby memory cells are selected by the address decoders X-DCR and Y-DCR. Depending upon the data written therein, the selected memory cells assume the form of memory MOSFET's (not shown) having a high threshold voltage relative to the select level of word lines, or assume the form of MOSFET's Qm having a low threshold voltage relative to the select level. The selected memory cells are served with a select level from the address decoder X-DCR via word lines. Therefore, the memory MOSFET's constituting memory cells are rendered nonconductive or conductive depending upon the data written therein. Depending upon the data written in the selected memory cells, therefore, the data lines assume the high level or the low level. Thus, the data of memory cells transmitted to the data lines are sent to the common data line CD via column switching MOSFET's that are rendered conductive by the address decoder Y-DCR, amplified through a sense amplifier SA, and are produced as read signals.

In FIG. 2, if the word line W0 has been broken at a position of mark X, select signals of the X address decoder X-DCR are not supplied to the memory cells that are formed on the side located further away from the X address decoder X-DCR than the broken position (mark X). That is, in FIG. 2, the select signals are not supplied to the four memory MOSFET's Qm of the upper left side. Therefore, even when complementary address signals $a_{xi}$, $a_{yi}$ that select these four memory MOSFET's are supplied to the X decoder X-DCR and to the Y decoder Y-DCR, the sense amplifier SA produces predetermined signals at all times. That is, data written in the four memory MOSFET's are not produced.

Therefore, breakage of word line (aluminum layer Al2) can be detected through the simple d-c operation test that was mentioned earlier, and ROM's which are regarded as defective can be prevented from being shipped.

Since the word line is composed of the aluminum layer Al2, the delay time until the select signal is transmitted to the memory cells can be shortened, making it possible to increase the operation speed of the ROM.

Figure 3:
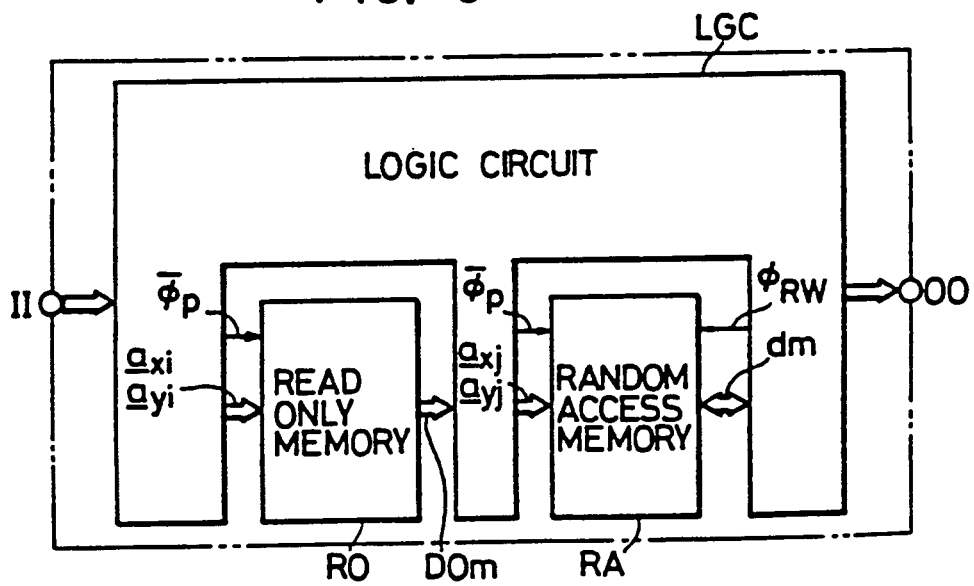
FIG. 3 is a block diagram of a large-scale semiconductor integrated circuit device according to an embodiment of the present invention.

FIG. 3 is a block diagram of a large-scale integrated circuit device to which the present invention is adapted, wherein the blocks surrounded by a broken line are formed on a semiconductor substrate by the technique for forming CMOS integrated circuits.

In FIG. 3, symbol LGC denotes a logic circuit which employs ROM RO and/or RAM RA in the step of effecting predetermined operations. As will be described later in detail with reference to FIGS. 4 to 8, the ROM RO receives complementary address signals $a_{xi}$, $a_{yi}$ which are produced by the logic circuit LGC, and sends the data of memory cells designated by the complementary address signals $a_{xi}$, $a_{yi}$ to the logic circuit LGC. As will be described later in detail with reference to FIGS. 9 and 10, the RAM RA receives the complementary address signals $a_{xi}$, $a_{yi}$ produced by the logic circuit LGC, as well as a write enable signal $\overline{WE}$, and sends the data stored in the memory cells designated by the complementary address signals $a_{xi}$, $a_{yi}$ to the logic circuit LGC, or stores the data of the logic circuit LGC in the memory cells that are designated by the complementary address signals $a_{xi}$, $a_{yi}$.

In FIG. 3, symbol II denotes external terminals for supplying signals from an external unit to the above-mentioned logic circuit LGC, and 00 denotes external terminals for supplying signals produced by the logic circuit LGC to an external unit. Further, symbol $\overline{\phi p}$ denotes a precharge signal which is the same as the one mentioned with reference to FIG. 1.

In a test for evaluating the ROM RO and RAM RA contained in the large-scale integrated circuit device, though there is no particular limitation, signals corresponding to the complementary address signals supplied to the ROM RO or RAM RA, are supplied through the external terminals II, and signals corresponding to output signals of the ROM RO or RAM RA are produced from the external terminal 00. In testing the RAM RA, furthermore, when data is to be written in the memory cells, though there exists no particular limitation, the signals corresponding to the data to be written are supplied through the external terminal II.

Figure 4:
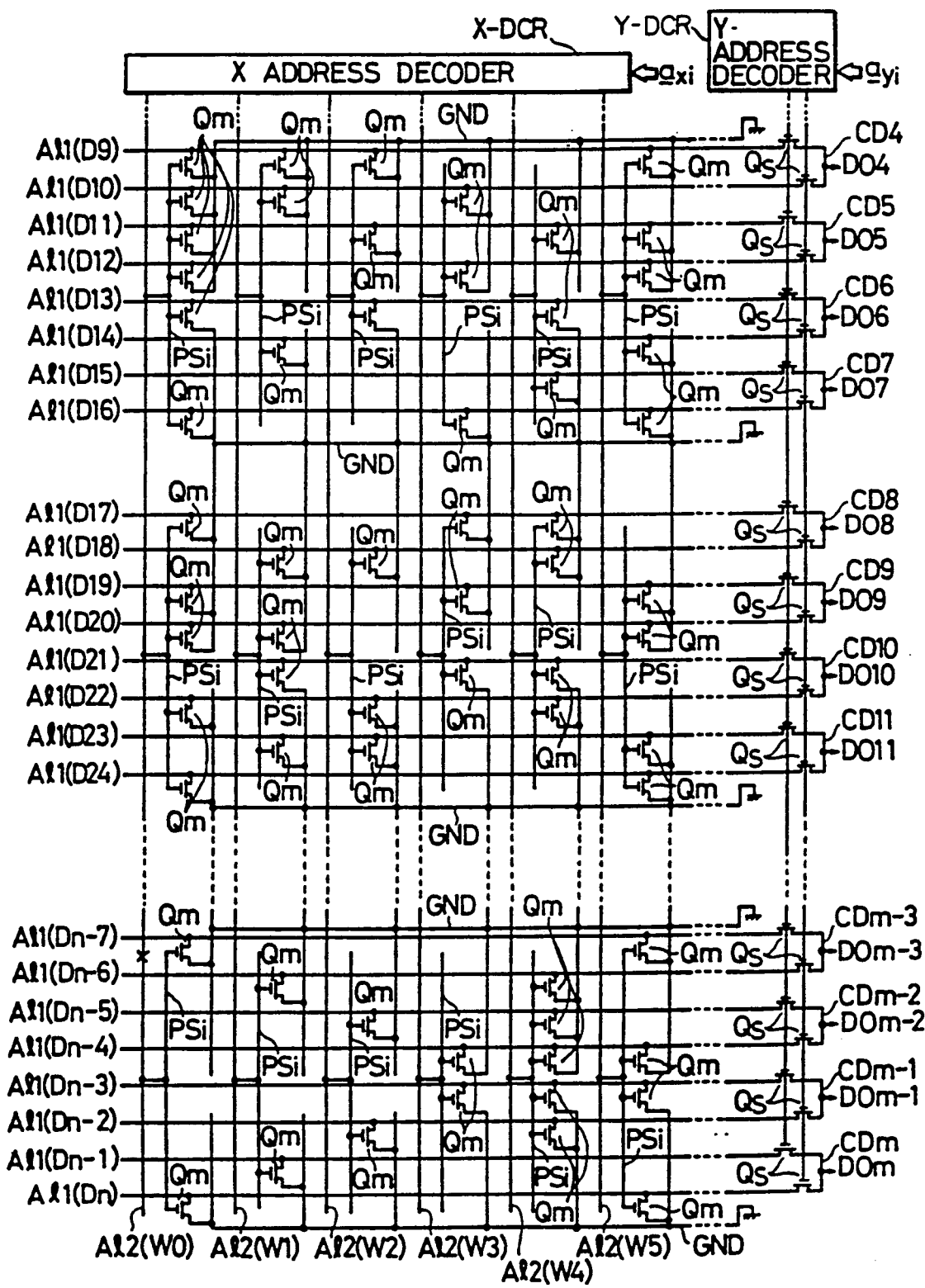
FIG. 4 is a circuit diagram of a ROM RO shown in FIG. 3 according to the embodiment.

FIG. 4 is a circuit diagram of the ROM RO of FIG. 3.

To simplify the drawing, FIG. 4 shows only a portion of the ROM RO. Principal circuits shown in FIG. 4 describe the arrangement that is really formed on the semiconductor substrate. The circuit arrangement will be described later in detail with reference to FIG. 5.

In FIG. 4, symbol X-DCR denotes an X address decoder, and Y-DCR denotes a Y address decoder. The X address decoder X-DCR receives a plurality of complementary address signals $a_{xi}$ supplied from the logic circuit LGC, selects word lines designated by the complementary address signals $a_{xi}$ out of a plurality of word lines forming the memory array, and supplies the select signal to the selected word lines only. The Y address decoder Y-DCR receives a plurality of complementary address signals $a_{yi}$ sent from the logic circuit LGC, forms a select signal, and supplies the select signal to MOSFET's which constitute column switches. Therefore, the MOSFET's Qs constituting column switches work to couple the data lines designated by the complementary address signals $a_{yi}$ among a plurality of data lines forming the memory array, to the common data lines CD.

The memory array consists of a plurality of word lines Al2(WO) to Al2(Wn), a plurality of data lines Al1(D0) to Al1(Dn), memory MOSFET's Qm which are selectively provided depending upon the write data at intersecting points of the word lines and data lines, and ground lines GND that supply ground potential of the circuit to the memory MOSFET's Qm. To simplify the drawing, FIG. 4 shows only word lines Al2(WO) to Al2(W5), data lines Al1(D9) to Al1(D24) and Al1(Dn-7) to Al1(Dn) only.

Each of the data lines is connected to one input terminal of the MOSFET Qs that will be switched by a select signal produced by the Y address decoder Y-DCR. In this embodiment, though there is no particular limitation, two data lines constitute one set, and one data line is selectively coupled to the common data line CD depending upon a signal produced by the Y address decoder Y-DCR. With regard, for example, to a set of data lines constituted by data lines D9 and D10, one of these data lines is selected by a signal produced by the Y address decoder Y-DCR, and the selected data line is connected to the corresponding common data line CD4. Therefore, the data which is transmitted from a memory MOSFET to the selected data line, is transmitted to the common data line CD4, and is supplied as output data D04 to the logic circuit LGC.

Although not diagramed in FIG. 4, each of the data lines is provided with a precharging MOSFET for precharging parasitic capacity that is present in the data lines. Though not specifically limited, the precharging MOSFET consists of a p-channel enhancement MOSFET like the precharging MOSFET's Q4 to Q7 illustrated in FIG. 1, and the gate electrode thereof is served with a precharge signal φp produced by the logic circuit LGC.

FIG. 4 shows only the memory MOSFET's Qm that will h=rendered conductive by a select signal from the X address decoder X-DCR. The memory MOSFET's Qm consist of n-channel MOSFET's. Namely, FIG. 4 shows only the memory MOSFET's that will be rendered conductive only when a select signal having a select potential.(e.g., 5 volts) is received from the X address decoder X-DCR, but does not show the memory MOSFET's that do not substantially work as MOSFET's.

In the above-mentioned memory array, gates of the memory MOSFET's Qm arranged along the same column are electrically coupled to the same word line, and drains of the memory MOSFET's Qm arranged along the same row are electrically coupled to the same data line.

In this embodiment, the memory array is constituted as described below in order to shorten the signal propagation delay time on the word lines, and so that breakage of word lines can be easily detected.

Namely, though there is no particular limitation, circuit blocks are constituted each substantially having eight memory MOSFET's Qm in the column direction. In other words, each column has a plurality of circuit blocks, each circuit block including substantially eight memory MOSFET's. Here, attention should be given to the fact that the eight memory MOSFET's constituting a circuit block include memory MOSFET's that do not substantially work as MOSFET's even when write data is input thereto. The memory MOSFET's constituting the circuit blocks have gate electrodes that are formed together with the electrically conductive polycrystalline silicon layer as a unitary structure. In other words, when a circuit block contains a plurality of memory MOSFET's that work as MOSFET's, their gate electrodes are coupled together by the electrically conductive polycrystalline silicon layer. Here, attention should be given to the fact that the electrically conductive polycrystalline silicon layer PSi couples the gate electrodes of only those memory MOSFET's that are contained in the same circuit block, but does not couple the gate electrodes of memory MOSFET's that are contained in other circuit blocks. The circuit blocks arranged along the same column are coupled to each other via an aluminum layer that forms a word line. That is, the electrically conductive polycrystalline silicon layers PSi of different circuit blocks are coupled to each other via the aluminum layer which forms a word line.

Figure 8:
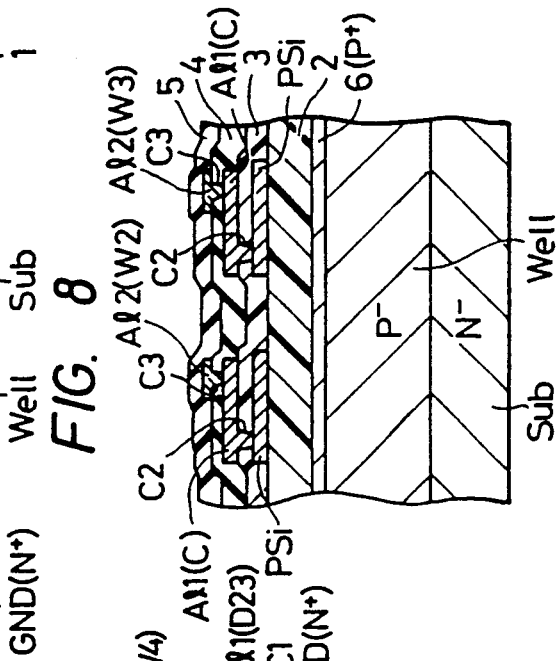
FIG. 8 is a section view along the line C—C of the layout diagram of FIG. 5.

In this embodiment, though there is no particular limitation, the word lines are formed by second aluminum layer Al2 as will be described later with reference to FIGS. 5 to 8. Further, although there is no particular limitation, the second aluminum layer Al2 and the electrically conductive polycrystalline silicon layer PSi can be coupled together as described below. That is, as shown in FIG. 8, the second aluminum layer Al2 can be coupled at one point to a first aluminum layer Al1(c) which is coupled to the electrically conductive polycrystalline silicon layer PSi. This helps reduce the area that is needed for coupling the aluminum layer Al2 and the electrically conductive polycrystalline silicon layer PSi together. It should be noted that Al1(c) is not one of the data lines of the memory.

Among the eight memory MOSFET's constituting a circuit block, four memory MOSFET's have source regions that are formed by a common N+-type semiconductor region that is coupled to a ground line GND which is formed substantially in parallel with the data line. In this embodiment, though there is no particular limitation, the ground line GND is formed by an N+-type semiconductor region and the N+-type semiconductor region GND and the above-mentioned common N-type semiconductor region have been formed as a unitary structure.

Drain regions of the memory MOSFET's arranged along the same line are connected to the first aluminum layer Al1 which forms a data line.

The ROM according to this embodiment operates nearly in the same manner as the aforementioned embodiment of FIGS. 1 and 2, and is not described here.

In FIG. 4, if the word line Al2(WO) has been broken at a position marked with X, the select signal is not supplied to the circuit blocks formed on the side further away from the X address decoder X-DCR than the broken position, just like the case of the embodiment of FIG. 1. Namely, in FIG. 4, the select signal is not supplied to the circuit blocks of the left lower side. Therefore, when the X address decoder X-DCR and the Y address decoder Y-DCR are served with complementary address signals $a_{xi}$, $a_{yi}$ that will select memory cells contained in these circuit blocks, the ROM RO sends to the logic circuit LGC predetermined signals only, instead of data that have been written in the selected memory cells.

This makes it possible to easily test the memories contained in a large-scale integrated circuit device.

Further, since the select signal is supplied to the circuit blocks through an aluminum layer, operation speed of the ROM RO can be increased.

Figure 5:
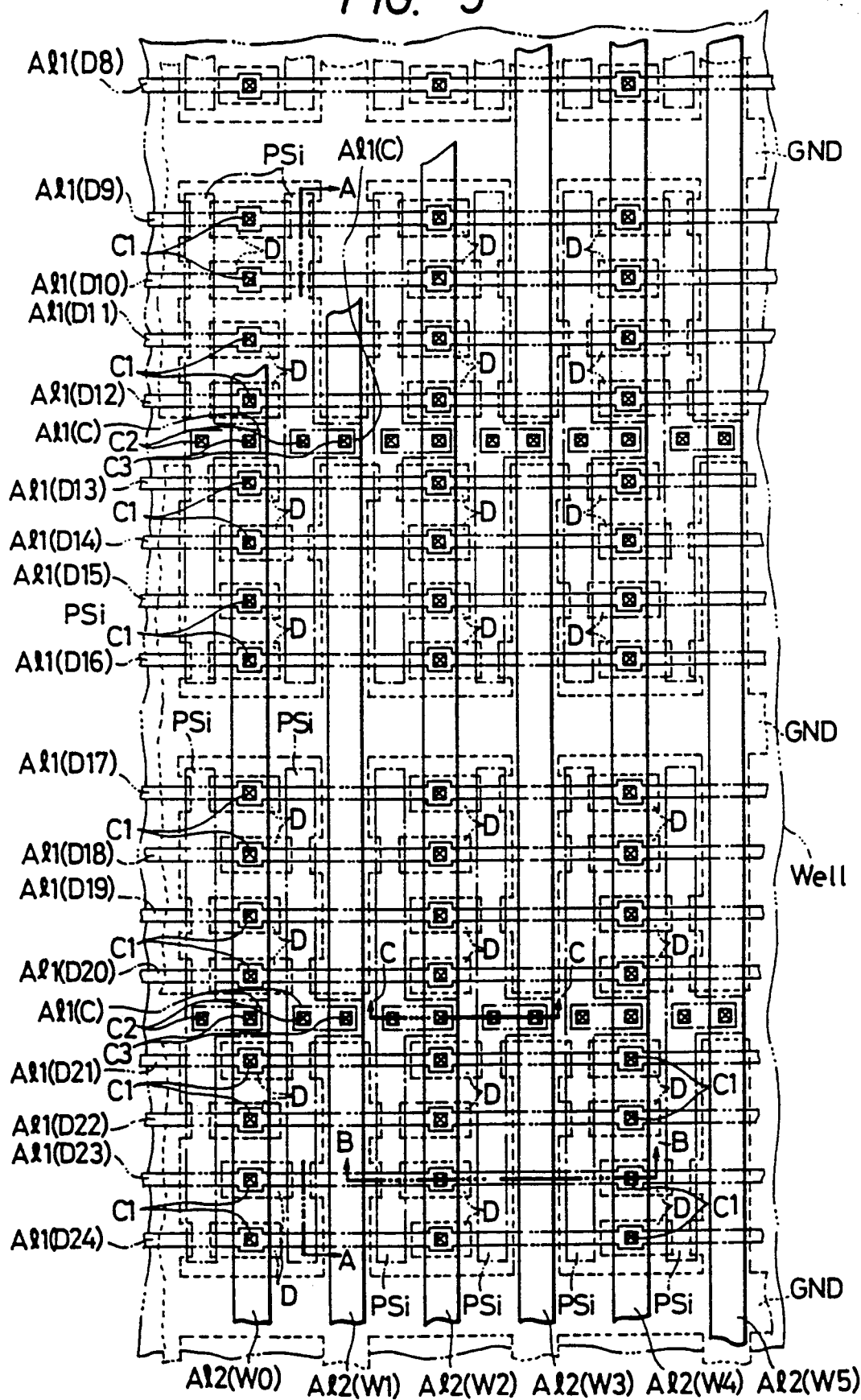
FIG. 5 is a plan view illustrating the layout of the ROM that corresponds to the circuit diagram of the ROM of FIG. 4.

FIG. 5 is a plan view showing a major portion of the ROM of FIG. 4. Namely, FIG. 5 is a plan view of the memory array consisting of data lines Al1(D9) to Al1(D24), word lines Al2(WO) to Al2(W5), memory MOSFET's provided at intersecting points of the data lines Al1(D9) to Al1(D24) and the word lines Al2(WO) to Al2(W5), and a plurality of ground lines GND, that are shown in FIG. 4.

In FIG. 5, the regions surrounded by broken lines represent N+-type semiconductor regions formed on the main surface of p−-type well regions Well that are formed in the semiconductor substrate (such as n−-type silicon substrate) Sub. Regions surrounded by one-dot chain lines represent electrically conductive polycrystalline silicon layers formed on the main surfaces of p−-type well regions Well via an insulation film (such as silicon dioxide film) that is formed on the main surfaces of the p−-type well regions Well. Regions surrounded by two-dot chain lines represent first aluminum layers Al1, and regions surrounded by solid lines represent second aluminum layers Al2. In FIG. 5, furthermore, symbol D denotes $N^+$-type semiconductor regions for forming drain regions of memory MOSFET's. The electrically conductive polycrystalline silicon layer PSi formed as a unitary structure together with the gate electrodes of a plurality of memory MOSFET's constituting the circuit block, is electrically connected to the second aluminum layer Al2(W) via the first aluminum layer Al1(C). Therefore, signals produced by the X address decoder X-DCR are transmitted to the gate electrode of memory MOSFET's which constitute the circuit blocks.

Though not shown in FIG. 5, an insulation film is formed between the first aluminum layer Al1 and the second aluminum layer Al2, and another insulation film is also formed between the first aluminum layer Al1 and the electrically conductive polycrystalline silicon layer.

In FIGS. 4, 5, 6, 7 and 8, the same portions are denoted by the same symbols.

Figure 6:
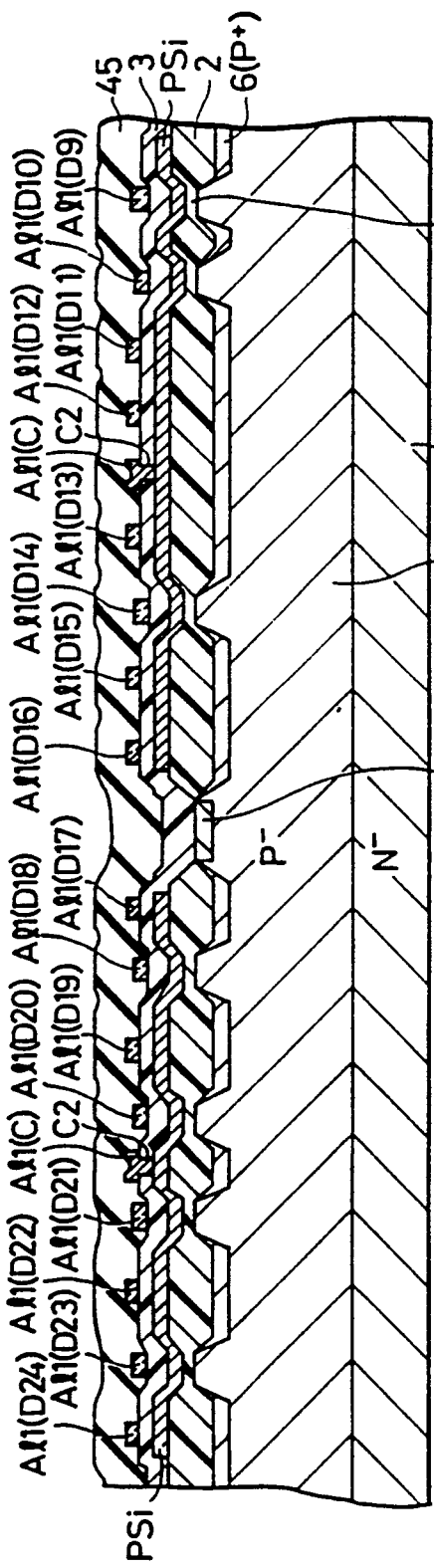
FIG. 6 is a section view along the line A—A of the layout diagram of FIG. 5.

FIG. 6 is a section view along the line A—A of FIG. 5.

In FIG. 6, reference numeral 1 denotes a thin insulation film (e.g., silicon dioxide film) which forms a gate insulation film for the memory MOSFET's. The enhancement-type memory MOSFET's are formed in the region where the gate insulation film 1 is formed. That is, the electrically conductive polycrystalline silicon layer formed on the gate insulation film 1 serves as gate electrode for the enhancement-type memory MOSFET's. On the other hand, reference numeral 2 denotes an insulation film (e.g., silicon dioxide film) which is thicker than the gate insulation film 1, and which forms a field dioxide film. Reference numeral 6 denotes a $p^+$type semiconductor region which forms a channel stopper. GND denotes an $N^+$-type semiconductor region that forms the ground line mentioned earlier. Reference numeral 3 denotes an intermediate insulation film which separates the electrically conductive polycrystalline silicon layer PSi from the first aluminum layer Al1, and which is composed of a phosphosilicate glass (hereinafter referred to as PSG film). Symbol C2 denotes a contact hole formed in the intermediate insulation film 3. The first aluminum layer Al1(C) and the electrically conductive polycrystalline silicon layer PSi are connected together via the contact hole C2. Reference numeral 45 denotes an insulation film which consists of an intermediate insulation film (e.g., PSG film) interposed between the first aluminum layer Al1 and the second aluminum layer Al2, and a final passivation film (e.g., $Si_3N_4$) formed on the second aluminum layer Al2. In FIG. 6, symbol Sub denotes an $n^-$-type semiconductor substrate, and Well denotes a $p^-$-type well region formed in $n^-$-type semiconductor substrate.

Figure 7:
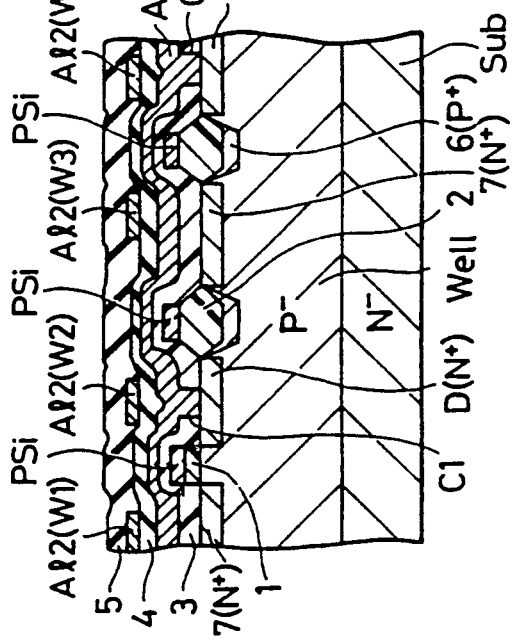
FIG. 7 is a section view along the line B—B of the layout diagram of FIG. 5.

FIG. 7 is a section view along the line B—B of FIG. 5.

In FIG. 7, Al1(D23) denotes a first aluminum layer which forms a data line Al1(D23) that is coupled to an $n^+$-type semiconductor region D via a contact hole C1 formed in the intermediate insulation film 3. The $n^+$-type semiconductor region D is formed on one main surface of the p-type well region Well to form drain regions for the memory MOSFET's. Reference numeral 4 denotes an intermediate insulation film formed on the main surface of the first aluminum layer Al1(D23). This prevents undesirable electrical connection between the first aluminum layer Al1 and the second aluminum layer Al2. Symbols Al2(W1) to Al2(W4) denote second aluminum layers that form word lines Al2(W1) to Al2(W4). Reference numeral 5 denotes a final passivation film, and 7 denotes an $n^+$-type semiconductor region that serves as source region for the memory MOSFET's, and that, though there is no particular limitation, is formed together with the above-mentioned $n^+$-type semiconductor region GND as a unitary structure.

In FIG. 7, attention should be given to the fact that insulation films formed under the electrically conductive polycrystalline silicon layers PSi have different thicknesses depending upon the polycrystalline silicon layers PSi. This enables the memory MOSFET's constituting the memory cells to work as enhancement-type MOSFET's or not to substantially work as MOSFET's, depending upon the data to be stored in the memory cells. In FIG. 7, the insulation film has a small thickness under the electrically conductive polycrystalline silicon layer PSi which is formed on the most left side. Therefore, a memory MOSFET of the enhancement-type is formed in this region. On the other hand, the insulation films formed under rest of the polycrystalline silicon layers PSi have a large thickness, so that memory MOSFET's formed in these regions will not substantially work as MOSFET's.

FIG. 8 is a section view along the line C—C of FIG. 5.

In FIG. 8, symbol C2 denotes a contact hole formed in the intermediate insulation film 3. The first aluminum layer Al1(C) and the electrically conductive polycrystalline silicon layer PSi are coupled together via the contact hole C2. Symbol C3 denotes a contact hole formed in the intermediate insulation film 4. The second aluminum layers Al2(W2), Al2(W3) and the first aluminum layer Al1(C) are coupled together via the contact hole C3. Thus, the second aluminum layer Al2(Wn) forming the word line Al2(W3) is electrically coupled to the electrically conductive polycrystalline silicon layer PSi that is formed together with gate electrodes of memory MOSFET's as a unitary structure.

Thus, the second aluminum layer Al2 is coupled to the electrically conductive polycrystalline silicon layer PSi via the first aluminum layer Al1(C). Accordingly, the second aluminum layer Al2 is coupled to the electrically conductive polycrystalline silicon layer PSi requiring a relatively small area. If it is attempted to directly couple the second aluminum layer Al2 and the electrically conductive polycrystalline silicon layer PSi together, a large contact hole must be formed to couple the aluminum layer Al2 and the polycrystalline silicon layer PSi together, since the thickness of intermediate insulation layer becomes relatively large therebetween. This requires a larger area for coupling than when the coupling is effected in the embodiment of the present invention.

By coupling the second aluminum layer Al2 and the electrically conductive polycrystalline silicon layer PSi as done in the embodiment of the present invention, the area for coupling can be reduced, and the degree of integration can be increased. In the present invention, however, the coupling method needs not necessarily be limited to the above-mentioned method only. The aluminum layer Al2 and the electrically conductive polycrystalline silicon layer may be directly coupled together.

Described below is a process for producing the semiconductor integrated circuit devices (refer to FIGS. 5 to 8).

(A) In an $n^-$-type single crystalline silicon substrate, a $p^-$-type well region is formed in a region where n-channel MOSFET's are to be formed. Next, in the $p^-$-type well region Well and the $n^-$-type silicon substrate, there are formed a silicon dioxide film and an $Si_3N_4$ film in a region where n-channel MOSFET's are to be formed and in a region where p-channel MOSFET's (such as the precharging MOSFET's mentioned above) are to be formed. In the region where $Si_3N_4$ film is not formed, boron ions and phosphorus ions are selectively diffused to form channel stoppers FIGS. 6 to 8 show a $p^+$-type channel stopper 6 only that is formed in the $p^-$-type well region. Next, with the $Si_2N_4$ film as a mask, the surface of the substrate is selectively oxidized to form a field dioxide film 2.

In this embodiment, there is formed neither the $SiO_2$ film nor the $Si_3N_4$ film in the region where there will be formed gate electrodes of memory MOSFET's that do not substantially work as MOSFET's. As shown in FIGS. 6 and 7, therefore, the $p^+$-type channel stopper 6 and the field oxide film 2 are also formed in the region where there will be formed gate electrodes of memory MOSFET's that do not substantially work as MOSFET's. On the other hand, the $SiO_2$ film and the $Si_3N_4$ film are formed in the region where there will be formed memory MOSFET's that work as enhancement-type MOSFET's. Therefore, the channel stopper and field dioxide film 2 are not formed in this region. In other words, the $SiO_2$ film and the $Si_3N_4$ film are formed or not formed depending upon the data that is to be written in the emory MOSFET's.

Here, the memory MOSFET's that work as enhancement-type MOSFET's are those which will be turned on or off by a signal supplied from the X address docoder X-DCR. On the other hand, the memory MOSFET's that do not substantially work as MOSFET's are those which remain turned off at all times irrespective of the signals supplied from the X address decoder X-DCR.

We will return again to the manufacturing process.

(B) The $SiO_2$ film and the $Si_3N_4$ film are removed, and the main surface of the region where the MOSFET's (e.g., memory MOSFET's that work as enhancement-type MOSFET's) are to be formed, is oxidized to form a thin gate insulation film ($SiO_2$ film) 1 in the substrate Sub and in the well region Well.

(C) A polycrystalline silicon layer is formed by the CVD method (chemical vapor deposition method) on the whole surfaces of the field oxide film 2 and the gate insulation film 1. Next, n-type impurities such as phosphorus ions are diffused to decrease the resistance of the polycrystalline silicon layer or, in other words, to form an electrically conductive polycrystalline silicon layer. In this case, n-type impurities are diffused at a high concentration. Thereafter, the polycrystalline silicon layer (electrically conductive polycrystalline silicon layer) having a small resistance is subjected to the selective etching relying upon the photo-etching technique. That is, the polycrystalline silicon layer is removed from the unnecessary portions except the portions that correspond to gate electrodes of MOSFET's and the portions that correspond to the aforementioned electrically conductive polycrystalline silicon layers PSi. Then, the gate insulation film which is exposed is removed by etching.

(D) A photo-resist mask is formed on the region where the p-channel MOSFET's (e.g., precharging MOSFET's) are to be formed, and n-type impurities such as phosphorus ions are implanted. Namely, phosphorus ions are implanted onto the main surface of the $p^-$-type well region Well being self-aligned with respect to the gate electrodes (inclusive of portions that will work as gate electrodes in the electrically conductive polycrystalline silicon layer PSi). Therefore, there are formed an $n^+$-type semiconductor region that will serve as a source region 7 for the n-channel MOSFET as well as an $n^+$-type semiconductor region that will serve as a drain region D therefor. In this case, the photo-resist mask has not been formed on the region where there will be formed a semiconductor region that corresponds to ground line GND. Consequently, the $n^+$-type semiconductor region GND is formed in the $p^-$-type well region as shown in FIG. 6.

The electrically conductive polycrystalline silicon layer PSi forms a gate electrode of the memory MOSFET's, and a wiring layer that connects the word line to the gate electrode of the memory MOSFET.

(E) The photo-resist mask formed in the above step (D) is removed. Then, a photo-resist mask is formed on the region where the n-channel MOSFET's are to be formed and on the region where the electrically conductive polycrystalline silicon layer PSi is to be formed, and p-type impurities such as boron ions are implanted. Namely, boron ions are implanted onto the substrate Sub being self-aligned with respect to the gate electrodes of p-channel MOSFET's. Consequently, there are formed a $p^+$-type semiconductor region that serves as a source region for the p-channel MOSFET and a $p^+$-type semiconductor region that serves as a drain region therefor.

In this step, boron ions are implanted at a relatively low concentration. Therefore, like the gate electrodes of n-channel MOSFET's, the gate electrodes of p-channel MOSFET's are formed by the n-type polycrystalline silicon layer.

(F) The photo-resist mask formed in the above step (E) is removed, and a PSG film 3 is formed by the CVD method on the whole surface.

(G) Contact holes Cl, C2 are formed in the PSG film 3 on the drain region D and in the PSG film 3 on the electrically conductive polycrystalline silicon layer PSi of the memory MOSFET's.

Then, an aluminum layer Al1 is formed by vaporization on the whole surface, and is formed into desired shapes by etching to obtain first aluminum layers Al1(C), Al1(D0) to Al1(Dn). The data lines Al1(D0) to Al1(Dn) are coupled to the drain regions D of memory MOSFET's via contact holes Cl, respectively (FIG. 7). Further, the wirings Al1(C) are coupled to the electrically conductive polycrystalline silicon layers PSi via contact holes C2, respectively (FIG. 8).

(H) Next, a PSG film 4 is formed again by the CVD method on the whole surface.

A contact hole C3 is formed in the PSG film 4 that is formed on the first aluminum layer Al1(C).

Then, an aluminum layer Al2 is formed by vaporization on the whole surface and is formed into desired shapes by etching to obtain second aluminum layers Al2(WO) to Al2(Wn). The second aluminum layers Al2(WO) to Al2(Wn) are coupled to the first aluminum layers Al1(C) via contact holes C3, respectively.

(I) A final passivation film 5 is formed on the whole surface to complete a semiconductor integrated circuit device as shown in FIGS. 6 to 8.

Figure 9:
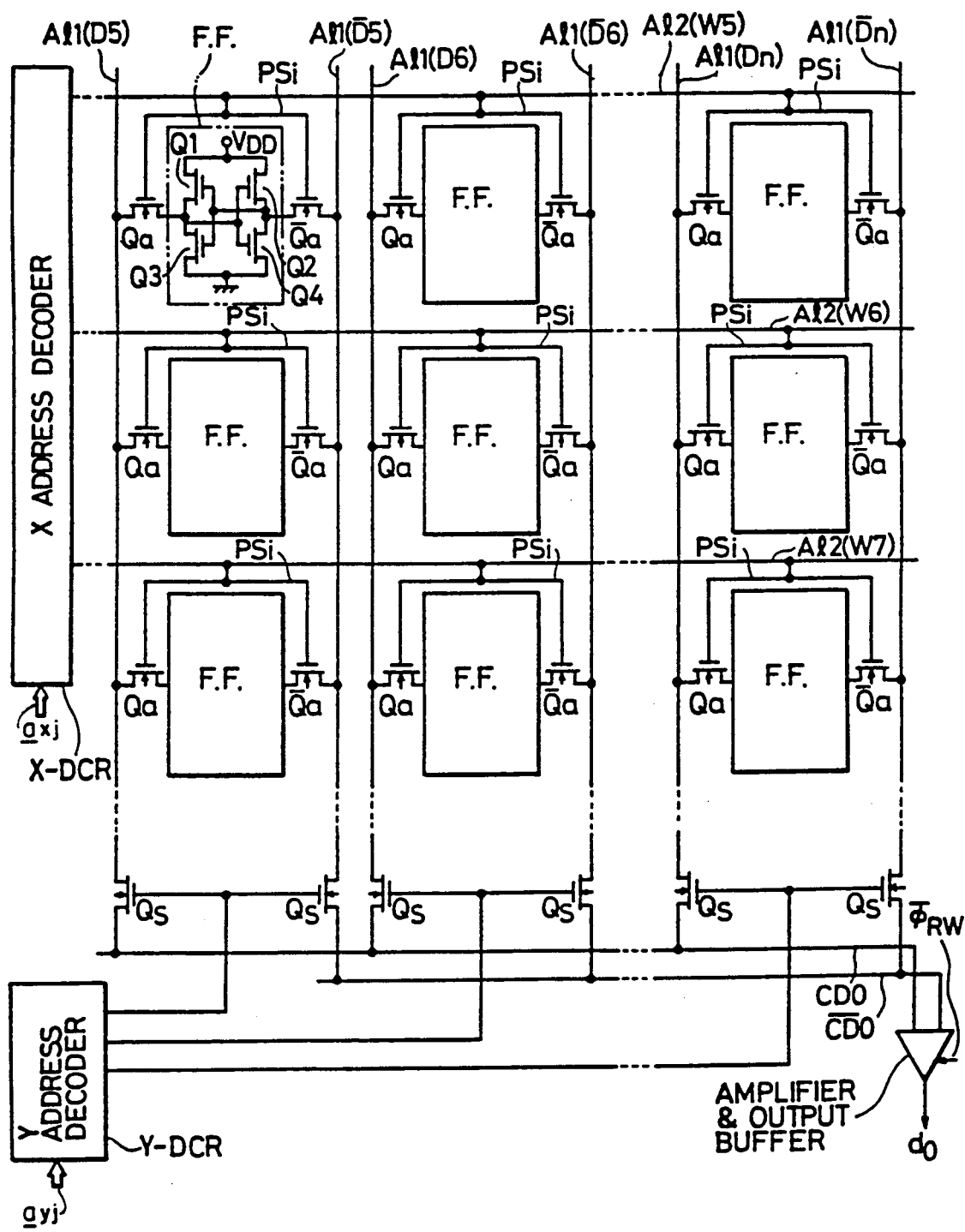
FIG. 9 is a circuit diagram of the RAM RA of FIG. 3 according to the embodiment.

FIG. 9 is a circuit diagram of the RAM RA shown in FIG. 3.

To simplify the drawing, FIG. 9 illustrates only a portion of the RAM RA. As will be mentioned later in detail with reference to FIG. 10, major circuits shown in FIG. 9 represent the arrangement that is really formed on the semiconductor substrate.

In FIG. 9, symbol X-DCR denotes an X address decoder, and Y-DCR denotes a Y address decoder. The X address decoder X-DCR receives a plurality of complementary address signals $a_{xj}$ supplied from the logic circuit LGC, selects a word line designated by the complementary address signals $a_{xj}$ out of a plurality of word lines forming the memory array, and sends a select signal to the selected word line only. The Y address decoder Y-DCR receives a plurality of complementary address signals $a_{yj}$ supplied from the logic circuit LGC to form a select signal, and supplies the select signal to MOSFET's that constitute column switches. Therefore, the MOSFET's constituting column switches work to couple a pair of complementary data lines designated by the complementary address signals $a_{yj}$ among a plurality pairs of complementary data lines forming the memory array, to a pair of common complementary data lines CD0, $\overline{CD0}$.

The memory array consists of a plurality of word lines Al2(W0) to Al2(Wn)-, a plurality pairs of complementary data lines Al1(D0), Al1($\overline{D0}$) to Al1(Dn), Al1($\overline{Dn}$), and memory cells provided at intersecting points of the word lines and data lines. To simplify the drawing, FIG. 9 shows only the word lines Al2(W5) to Al2(W7), pairs of data lines Al1(D5), Al1($\overline{D5}$), Al1(D6), Al1($\overline{D6}$) and Al1(Dn), Al1($\overline{Dn}$), and memory cells provided at intersecting points of word lines Al2(W5) to Al2(W7) and pairs of data lines Al1(D5), Al1($\overline{D5}$), Al1(D6), Al1($\overline{D6}$) and Al1(Dn), Al1($\overline{Dn}$).

The pairs of data lines are connected to input/output terminals of one side of the MOSFET's Qs that will be switched by a select signal sent from the Y address decoder Y-DCR. The input/output terminals of the other side of these MOSFET's Qs are coupled to the pair of common complementary data lines CD0, $\overline{CD0}$. Among a plurality pairs of complementary data lines Al1(D0), Al1($\overline{D0}$) to Al1(Dn), Al1($\overline{Dn}$), a pair of complementary data lines designated by the complementary address signals $a_{yj}$ are coupled to the pair of common complementary data lines CD0, $\overline{CD0}$ via the MOSFET's Qs. Therefore, the data transmitted from a memory cell to the pair of complementary data lines, is then transmitted to the pair of common complementary data lines via MOSFET's Qs, and is supplied to the logic circuit LGC via an amplifier circuit/output buffer.

Though not diagrammed in FIG. 9, the RAM RA is provided with an input buffer which receives the data supplied from the logic circuit LGC and which transmits it to the pair of common complementary data lines CD0, $\overline{CD0}$. In the writing operation, the data supplied from the logic circuit LGC is transmitted to the common complementary data lines CD0, $\overline{CD0}$ via the input buffer. The data is then transmitted to the pair of complementary data lines that are coupled to the pair of common complementary data lines CD0, $\overline{CD0}$ via the MOSFET's Qs, and is written in a memory cell.

Operations of the amplifier circuit/output buffer and the input buffer are controlled by a control signal $\phi_{RW}$ produced by the logic circuit LGC. For instance, when the control signal $\phi_{RW}$ has the low level, the amplifier circuit/output buffer operates to produce the data of the memory cells. In this case, the input buffer remains inoperative. When the control signal $\phi_{RW}$ has the high level, on the other hand, the input buffer operates to write the data in the memory cells. In this case, the amplifier circuit/output buffer is rendered inoperative.

Though not shown in FIG. 9, each of the data lines is provided with a precharging MOSFET which is constructed in the same manner as the precharging MOSFET mentioned with reference to FIG. 1, and which receives a precharge signal $\overline{\phi p}$ through the gate thereof.

Each of the memory cells consists of a flip-flop circuit FF having a pair of input/output terminals, an n-channel enhancement MOSFET Qa having a first input/output electrode coupled to one input/output terminal of said flip-flop circuit and having a second input/output electrode connected to the data line Al1(D), and an n-channel enhancement MOSFET $\overline{Qa}$ having a first input/output electrode coupled to the other input/output terminal of said flip-flop circuit and having a second input/output terminal coupled to the data line Al1($\overline{D}$). Though not specifically limited, the flip-flop circuit consists of p-channel MOSFET's $Q_1$, $Q_2$ and n-channel MOSFET's $Q_3$, $Q_4$; i.e., a CMOS flip-flop circuit.

In the above-mentioned memory array, the gates of MOSFET's Qa, $\overline{Qa}$ constituting memory cells along the same row are electrically coupled to the same word line. Further, the second input/output electrodes of MOSFET's Qa, $\overline{Qa}$ constituting memory cells along the same column are coupled to the same data line.

The gate electrode of MOSFET Qa and the gate electrode of MOSFET $\overline{Qa}$ are coupled together through the electrically conductive polycrystalline silicon layer PSI. This PSi layer may be referred to as a "divided sub-word line". Here, attention should be given to the fact that the electrically conductive polycrystalline silicon layer PSi has not been coupled to gate electrodes of MOSFET's of other memory cells The electrically conductive polycrystalline silicon layer is coupled to a corresponding word line. Therefore, a signal from the X address decoder X-DCR is transmitted to the memory cell via the word line. When the signal transmitted to the memory cell is a select signal (e.g., a signal of 5 volts), the MOSFET's Qa, $\overline{Qa}$ constituting the memory cell are turned on, whereby the data is read out from the memory cell or is written therein.

The RAM RA of this embodiment receives and produces the data with a plurality of bits as a unit, as shown in FIG. 3. To simplify the description, however, the circuit of FIG. 9 receives or produces the data with a bit as a unit. In practice, the circuit shown in FIG. 9 are provided in a plurality of numbers. The X address decoder X-DCR and the Y address decoder Y-DCR, however, will be used commonly. The present invention, however, should not be limited to a RAM(ROM) which receives and produces the data with a plurality of bits as a unit.

Though there is no particular limitation, the word lines in this embodiment consist of second aluminum Al2. Further, the second aluminum layers Al2 forming the word lines and the electrically conductive polycrystalline silicon layers PSi are coupled together via the first aluminum layers Al1(C) in the same manner as described with reference to FIGS. 5 to 8. The data lines consist of first aluminum layers Al1.

The RAM shown in FIG. 9 operates in the same manner as the widely known static RAM, and is not described here.

In case a word line is broken, the select signal is not transmitted to the memory cells that are formed on the side further away from the X address decoder X-DCR than the broken portion, as in the case of the ROM of FIG. 4. Therefore, the data stored in these memory cells is not read out. This makes it possible to easily test the RAM's contained in a large-scale integrated circuit device. Further, since the word lines have been composed of aluminum layers, the RAM can be operated at high speeds.

Figure 10:
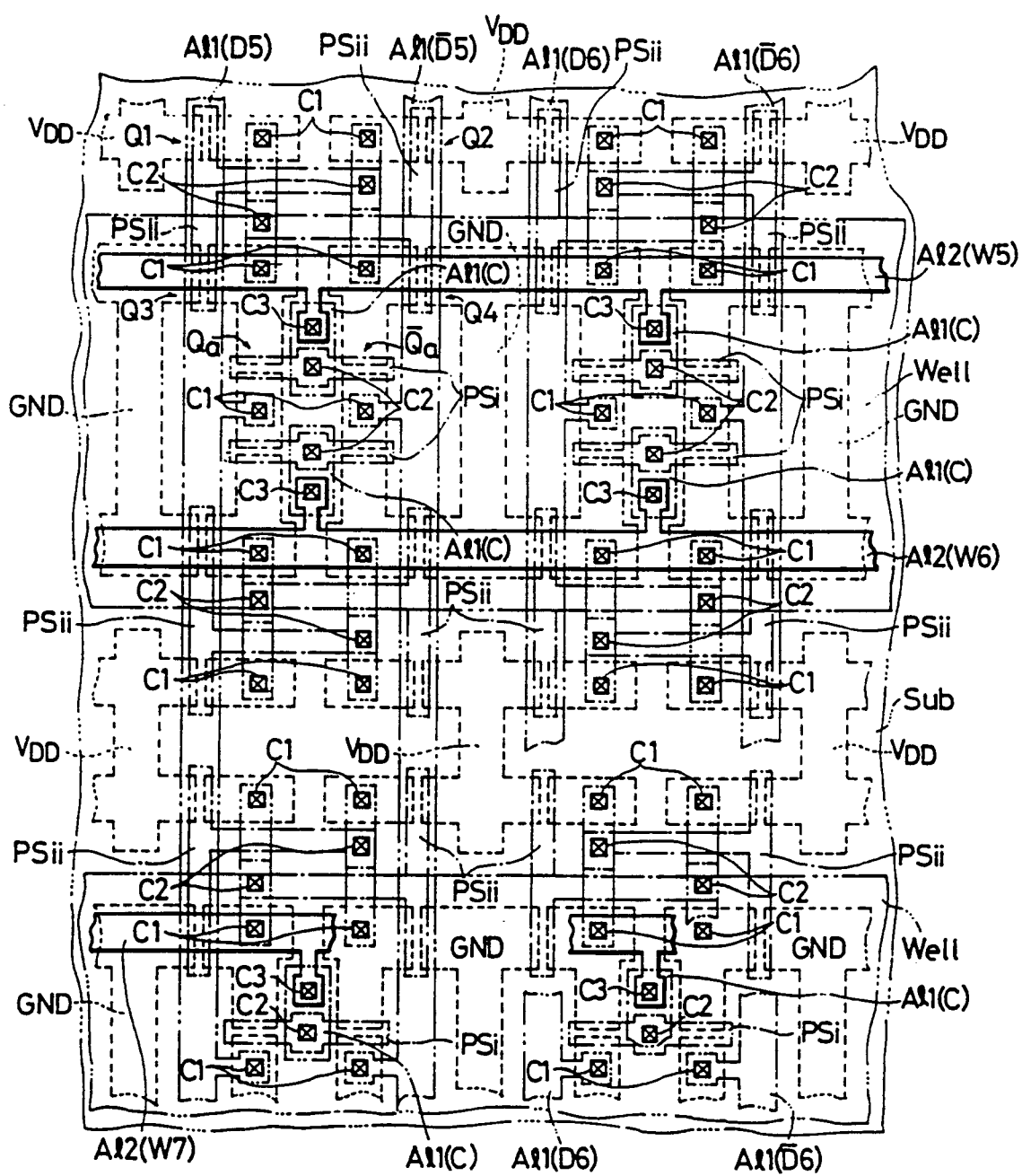
FIG. 10 is plan view illustrating the layout of a RAM that corresponds to the circuit diagram of FIG. 9.

FIG. 10 is a plan view illustrating a major portion of the RAM of FIG. 9.

Namely, FIG. 10 is a plan view of the memory array consisting of pairs of complementary data lines Al1(D5), Al1($\overline{D5}$), Al1(D6), Al1($\overline{D6}$), word lines Al2(W5) to Al2(W7), and memory cells provided at intersecting points of the pairs of data lines Al1(D5), Al1($\overline{D5}$), Al1(D6), Al1($\overline{D6}$) and word lines Al2(W5) to Al2(D7).

In FIG. 10, the same portions as those of FIGS. 5 to 9 are denoted by the same symbols Namely, the portion surrounded by a four-dot chain line is an n$^-$-type silicon substrate Sub, and the regions surrounded by three-dot chain lines are p$^-$-type well regions Well formed on one main surface of the n$^-$-type silicon substrate Sub. The regions surrounded by broken lines are p$^+$-type semiconductor regions formed on the main surface of the n$^-$-type silicon substrate Sub, or are n$^+$-type semiconductor regions formed in the p$^-$-type well regions Well. The regions surrounded by dot-dash lines represent electrically conductive polycrystalline silicon layers PSi, PSii formed on the surface of an insulation film that is formed on the main surface of the substrate Sub or the well regions Well. The regions surrounded by two-dot chain lines represent first aluminum layers Al1(C), Al1(D5), Al1(($\overline{D5}$), Al1(D6), Al1($\overline{D6}$) formed on the surface of an insulation film that is formed on the electrically conductive polycrystalline silicon layers PSi, PSii. The regions surrounded by solid lines represent second aluminum layers Al2(W5) to Al2(W7) formed on the surface of an insulation film that is formed on the first aluminum layers.

In FIG. 10, symbol C1 denotes contact holes formed in the insulation film 3 to couple the P$^+$-type or n$^+$-type semiconductor regions and the first aluminum layers Al1 together, like the contact holes C1 shown in FIG. 7, the insulation film 3 being interposed therebetween. Symbol C2 are denotes contact holes formed in the insulation film 3 to couple the electrically conductive polycrystalline silicon layers PSi, PSii and the first aluminum layers Al1 together, like the contact holes C2 of FIG. 8, the insulation film 3 being interposed therebetween, and symbol C3 denotes contact holes formed in an insulation film 4 to couple the first aluminum layers Al1 and the second aluminum layers Al2 together, like the contact holes C3 shown in FIG. 8, the insulation film 4 being interposed therebetween.

Even in this embodiment, use is made of first aluminum layers Al1(C) to couple the second aluminum layers Al2(Wn) forming the word lines and the electrically conductive polycrystalline silicon layers PSi together, like the embodiment described in conjunction with FIG. 5

The electrically conductive polycrystalline silicon layers PSi form gate electrodes of the MOSFET's Qa, $\overline{Q}$a, and the wiring layers that couple these gate electrodes to the word lines (second aluminum layers) Al2(Wn). The electrically conductive polycrystalline silicon layers PSii form gate electrodes of the MOSFET's Q1 to Q4 and the wiring layers for forming flip-flop circuits.

In FIG. 10, the source regions of p-channel MOSFET's Q1, Q2 are formed by P$^+$-type semiconductor regions V$_{DD}$. The p$^+$-type semiconductor regions are coupled together via second aluminum layers Al2 (not shown), and a voltage V$_{DD}$ is applied to the source regions of the individual p-channel MOSFET's via the second aluminum layers Al2. Further, the source regions of n-channel MOSFET's are formed by n$^+$-type semiconductor regions GND which are coupled together via, for example, the second aluminum layers Al2. Ground potential of the circuit is applied to the source regions of the individual n-channel MOSFET's via the second aluminum layers Al2.

A final passivation film 5 (not shown) is formed on the second aluminum layers Al2 as in the embodiment mentioned in conjunction with FIGS. 5 to 8.

The RAM according to this embodiment is manufactured by the same manufacturing method as the one mentioned with reference to FIGS. 5 to 8, and is not described here.

For the purpose of easy comprehension, symbols of the corresponding MOSFET's of FIG. 9 are employed in the plan view of memory cells described on the upper left side of FIG. 10. Further, in the plan view of memory cells described on the lower side of FIG. 10, the second aluminum layer Al2(W7) and the first aluminum layers Al1(D6), Al1($\overline{D6}$) have been described being partly removed away.

Figure 11:
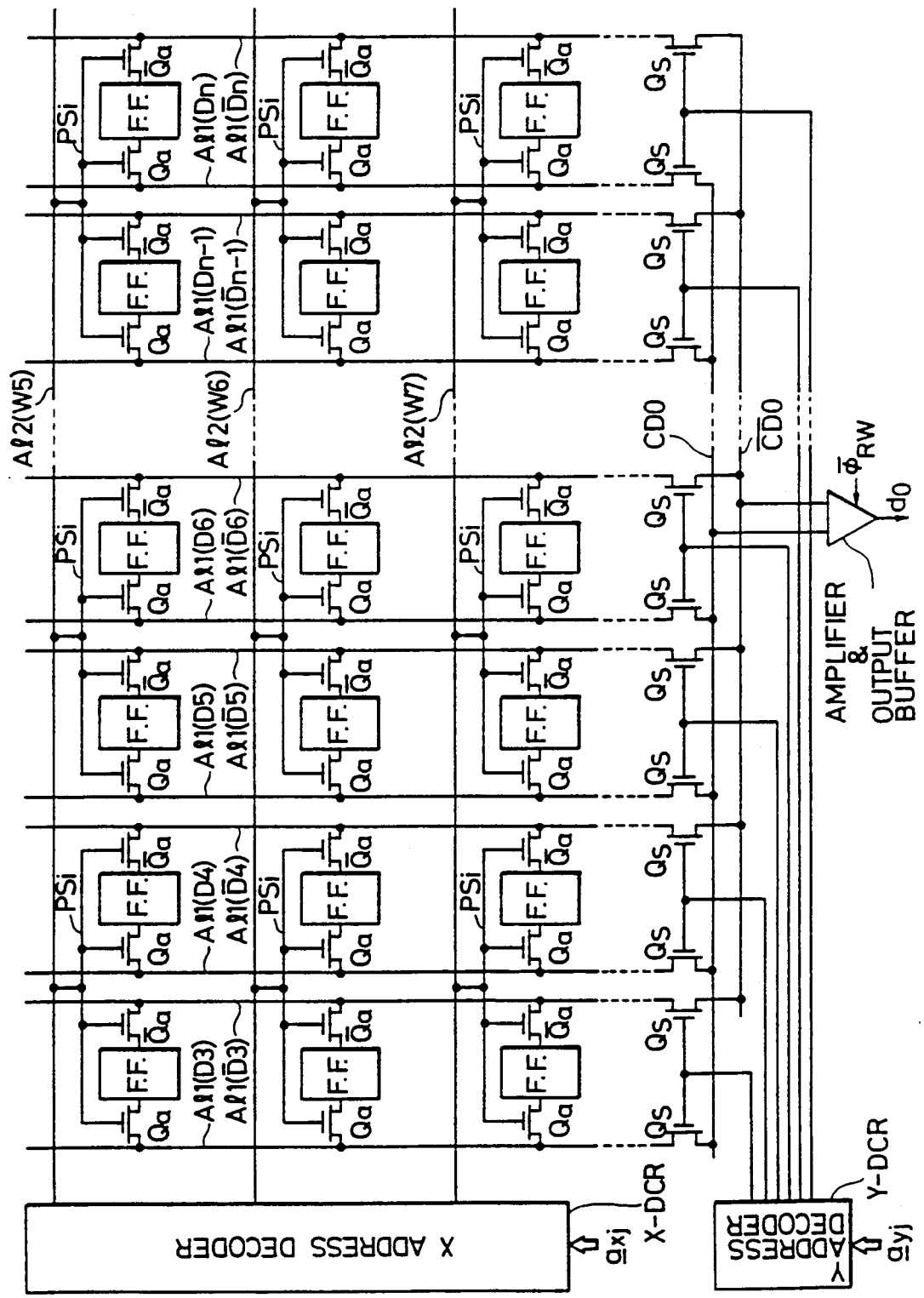
FIG. 11 is a circuit diagram of a RAM according to another embodiment of the present invention.

FIG. 11 shows a RAM according to another embodiment of the present invention.

In FIG. 11, the same portion as those of FIG. 9 are denoted by the same symbols. Construction and operation of the RAM of FIG. 11 are nearly the same as construction and operation of the RAM of FIG. 9. Therefore, described below are differences between the RAM shown in FIG. 11 and the RAM shown in FIG. 9, and similarities are not referred to.

That is, in the RAM shown in FIG. 11, a circuit block is constituted by a plurality of (two in this embodiment) memory cells that are formed along the same row of memory cells. The electrically conductive polycrystalline silicon layer PSi is coupled to the gate electrodes of MOSFET's Qa, $\overline{Q}$a for selecting an address provided in the same circuit block, but is not coupled to the gate electrodes of MOSFET's Qa, $\overline{Q}$a for selecting an address provided in other circuit blocks. The electrically conductive polycrystalline silicon layer PSi is coupled to the corresponding word lines like the electrically conductive polycrystalline silicon layer PSi shown in FIG. 9. Namely, in FIG. 9, a circuit block was constituted by one memory cell. In this embodiment, however, a circuit block is constituted by a plurality of memory cells. This makes it possible to reduce the number of contact holes for coupling the second aluminum layer Al2(Wn) and the electrically conductive polycrystalline silicon layer PSi together. This helps reduce the restriction that stems from the number of contact holes or the areas occupied by the contact holes, when an attempt is made to reduce the size of memory cells.

According to the present invention as will be obvious from the foregoing description, the effects are obtained as described below.

Signals are transmitted to the individual circuit blocks through metal wiring layers; i.e., signals are transmitted to the circuit blocks with relatively small delay times.

Accordingly, memories, or memories that are contained in a semiconductor integrated circuit device can be operated at high speeds.

When a signal is supplied from a first wiring layer to a second wiring layer contained in a first circuit block, the signal is also supplied substantially simultaneously from the first wiring layer to a third wiring layer contained in a second circuit block. The second wiring layer and the third wiring layer have not been directly coupled together. Therefore, when the first wiring layer is broken, the signal is supplied to the second wiring layer but is not supplied to the third wiring layer. Hence, the first circuit block operates properly, but the second circuit block does not properly work (or does not work). Accordingly, breakage of the first wiring can be easily detected by the d-c operation test that was mentioned earlier. In other words, whether the first wiring is broken or not can be detected by a simple test.

Each of the circuit blocks contains circuit elements and wiring means having a relatively large resistivity for connecting the circuit elements. The wiring means having a relatively large resistivity is connected at one place to a metal wiring layer that reduces the propagation delay time. Therefore, the circuit blocks are served with predetermined signals via metal wiring layers at all times. If a metal wiring layer breaks, the signal is not transmitted to the circuit blocks located on the more remote side than the broken portion. Therefore, a defect in the metal wiring layer that shortens the propagation delay time, can be detected through the d-c operation test. This fact also makes it possible to sort out the semiconductor integrated circuit device at high speeds maintaining increased reliability. The circuit blocks located on the more remote side than the broken portion do not properly operate (or do not operate). Accordingly, the internal circuits in the large-scale integrated circuits can be evaluated relatively simply.

The invention has been specifically described in the foregoing by way of examples. However, it should be noted that the invention is in no way limited to the above-mentioned embodiments only, but can be modified in a variety of other ways without departing from the spirit and scope of the invention.

In the foregoing were described examples in which the invention was adapted to a lateral ROM and a static RAM. The invention, however, should not necessarily be limited thereto only, but can be widely utilized for semiconductor integrated circuit devices that include memory array (word lines, data lines, or ground lines of the circuit) of various programmable ROM's of dynamic RAM's, or that include circuits in which a number of circuit elements are connected to relatively long wirings.

It is to be understood that the above-described arrangements are simply illustrative of the application of the principles of this invention. Numerous other arrangements may be readily devised by those skilled in the art which embody the principles of the invention and fall within its spirit and scope.

Although aluminum is particularly preferred, other metals could possibly be used in its place while still falling within the scope of the intended patent protection.

I claim:

1. A semiconductor integrated circuit device comprising:
    an address decoder circuit which produces a signal upon decoding an applied address;
    a plurality of word lines connected to said address decoder circuit;
    sub-word lines having first and second ends and connected to said plurality of word lines at a connecting portion of said sub-word lines disposed between the first and second ends; and
    first memory cells and second memory cells connected to said sub-word lines and wherein the signal from said address decoder circuit being supplied to said subword lines connected to one of said plurality of word lines substantially simultaneously and said first memory cells connected to one of said sub-word lines are between said connecting portion and said first end and said second memory cells connected to one of said sub-word lines are between said connecting portion and said second end.

2. A semiconductor integrated circuit device according to claim 1, wherein each of said first and second memory cells includes a MISFET having a gate electrode and source and drain regions.

3. A semiconductor integrated circuit device according to claim 2, wherein said gate electrode is connected to one of said sub-word lines.

4. A semiconductor integrated circuit device according to claim 3, wherein said gate electrode is integrally formed with one of said sub-word lines.

5. A semiconductor integrated circuit device according to claim 4, wherein said word lines are formed of aluminum.

6. A semiconductor integrated circuit device according to claim 5, wherein said sub-word lines comprise electrically conductive polycrystalline silicon layers.

7. A semiconductor integrated circuit device according to claim 1, wherein a number of said first memory cells is the same as a number of said second memory cells.

8. A semiconductor integrated circuit device according to claim 1, wherein said sub-word lines extend along said word lines.

9. A semiconductor integrated circuit device according to claim 8, wherein said first and second memory cells are arranged in line with said sub-word line.

10. A semiconductor integrated circuit device according to claim 1 wherein:
    each sub-word line has first and second ends and is connected to one of said word lines at the connecting portion of the sub-word line.

11. A semiconductor integrated circuit device comprising:
    a plurality of word lines extending in a first direction;
    a plurality of data lines extending in a second direction which is perpendicular to said first direction;
    a first means for selecting a word line from said plurality of word lines and which applies a signal to the selected word line;
    a second means for selecting a data line from said plurality of data lines;
    sub-word lines extending in said first direction and a sub-word having first and second ends, and at least two sub-word lines connected to at least one of said plurality of word lines; and
    first memory cells and second memory cells connected to said sub-word lines, first and second memory cells being connected to said data lines and the signal from said first means being supplied to said at least two sub-word lines substantially simultaneously and said first memory cells are connected to one of said subword lines between a connecting portion of said sub-word lines and said first end and said second memory cells are connected to said one of said sub-word lines between said connecting portion of said sub-word lines and said second end.

12. A semiconductor integrated circuit device according to claim 11, wherein said first and second memory cells includes a MISFET with a gate electrode and source and drain regions.

13. A semiconductor integrated circuit device according to claim 12, wherein said gate electrode is connected to one of said sub-word lines and one of said source and drain region is connected to one of said data lines.

14. A semiconductor integrated circuit device according to claim 13, wherein said gate electrode is integrally formed with one of said sub-word lines.

15. A semiconductor integrated circuit device according to claim 14, wherein said word lines are formed of aluminum.

16. A semiconductor integrated circuit device according to claim 15, wherein said sub-word lines comprise electrically conductive polycrystalline silicon layers.

17. A semiconductor integrated circuit device according to claim 16, wherein the other of said source and drain regions is connected to a ground potential.

18. A semiconductor integrated circuit device according to claim 11, wherein a number of said first memory cells is the same as a number of said second memory cells.

19. A semiconductor integrated circuit device according to claim 11, wherein said at least two sub-word lines are substantially parallel to said word line connected to said at least two sub-word lines.

20. A semiconductor integrated circuit device according to claim 19, wherein said first and second memory cells are arranged in line with said sub-word line.

21. A semiconductor integrated circuit device according to claim 11 wherein:
each sub-word line has first and second ends; and
each of said first and second memory cells is connected to said data lines.

* * * * *